US010614865B1

(12) United States Patent
Mohanty et al.

(10) Patent No.: US 10,614,865 B1
(45) Date of Patent: Apr. 7, 2020

(54) BOOST GENERATION CIRCUITRY FOR MEMORY

(71) Applicant: QUALCOMM Incorporated, San Diego, CA (US)

(72) Inventors: Shiba Narayan Mohanty, Bangalore (IN); Rakesh Kumar Sinha, Bangalore (IN); Rahul Sahu, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/162,592

(22) Filed: Oct. 17, 2018

(51) Int. Cl.
  *G11C 5/14* (2006.01)
  *G11C 7/12* (2006.01)
  *G11C 8/08* (2006.01)
  *G11C 11/00* (2006.01)

(52) U.S. Cl.
  CPC ............ *G11C 8/08* (2013.01); *G11C 5/145* (2013.01); *G11C 7/12* (2013.01); *G11C 11/005* (2013.01)

(58) Field of Classification Search
  CPC .................. G11C 5/145; G11C 7/12
  See application file for complete search history.

(56) References Cited

U.S. PATENT DOCUMENTS

| 9,455,028 | B1 * | 9/2016 | Sahu | ............. G11C 7/14 |
| 9,875,790 | B1 * | 1/2018 | Sinha | ............. G11C 11/419 |
| 2009/0213504 | A1 * | 8/2009 | Hallstrom | ............. H01T 15/00 361/16 |
| 2010/0232244 | A1 * | 9/2010 | Hirabayashi | ............. G11C 7/12 365/208 |
| 2015/0076575 | A1 * | 3/2015 | Wu | ............. H01L 27/1116 257/296 |
| 2016/0042784 | A1 * | 2/2016 | Rim | ............. G11C 11/419 365/154 |
| 2017/0004874 | A1 * | 1/2017 | Braceras | ............. G11C 11/419 |

* cited by examiner

*Primary Examiner* — Hoai V Ho
*Assistant Examiner* — Jay W. Radke
(74) *Attorney, Agent, or Firm* — Patterson & Sheridan, L.L.P.

(57) ABSTRACT

Certain aspects of the present disclosure provide methods and apparatus for generating a negative boost voltage for memory write operations. One example memory circuit generally includes at least one memory bank, a write circuit coupled to the at least one memory bank, and a boost generation circuit coupled to the write circuit. The boost generation circuit generally includes a first node coupled to a reference potential node of the write circuit; a second node; a first capacitive element having a first terminal coupled to the first node of the boost generation circuit; a first switch configured to selectively couple the first node to a reference potential node for the memory circuit; and a second switch configured to selectively couple a second terminal of the first capacitive element to the second node of the boost generation circuit.

19 Claims, 13 Drawing Sheets

BOOST GENERATION CIRCUITRY FOR MEMORY

TECHNICAL FIELD

Certain aspects of the present disclosure generally relate to memory, and more particularly, to boost generation circuitry for memory devices.

INTRODUCTION

A memory device (e.g., semiconductor memory) is an electronic digital data storage device, typically implemented in an integrated circuit (IC). Typically, a semiconductor memory IC comprises an array of memory cells, where each memory cell stores one bit of binary data. There are many different types of memory devices, such as read-only memory (ROM) and random-access memory (RAM), including both static random-access memory (SRAM) and dynamic random-access memory (DRAM). For example, SRAM is a type of semiconductor memory that uses latching circuitry to store data, whereas DRAM uses a capacitor and a transistor to store each bit. SRAM is typically faster than DRAM and need not be periodically refreshed, but SRAM may be less dense and more expensive per bit than DRAM. Hence, SRAM may typically be used in smaller cache memories, whereas DRAM may be used for main memories.

BRIEF SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Certain aspects of the present disclosure provide a memory circuit. The memory circuit generally includes at least one memory bank, a write circuit coupled to the at least one memory bank, and a boost generation circuit coupled to the write circuit. The boost generation circuit generally includes a first node coupled to a reference potential node of the write circuit; a second node; a first capacitive element having a first terminal coupled to the first node of the boost generation circuit; a first switch configured to selectively couple the first node to a reference potential node for the memory circuit; and a second switch configured to selectively couple a second terminal of the first capacitive element to the second node of the boost generation circuit.

Certain aspects of the present disclosure provide a method of writing data to a memory circuit. The memory circuit typically includes at least one memory bank, a write circuit coupled to the at least one memory bank, and a boost generation circuit coupled to the write circuit. The method generally includes charging a first capacitive element of the boost generation circuit having a first terminal coupled to a first node of the boost generation circuit, wherein the first node is coupled to a reference potential node of the write circuit and wherein the charging comprises: closing a first switch of the boost generation circuit, the first switch being coupled between the first node and a reference potential node for the memory circuit; opening a second switch of the boost generation circuit coupled between a second terminal of the first capacitive element and a second node of the boost generation circuit; and closing a third switch of the boost generation circuit coupled between the second terminal of the first capacitive element and a voltage rail having a higher potential than the reference potential node for the memory circuit; and generating a negative potential at the first node of the boost generation circuit during a write operation by: opening the first switch, opening the third switch, and pulling the second node to a logic low level.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
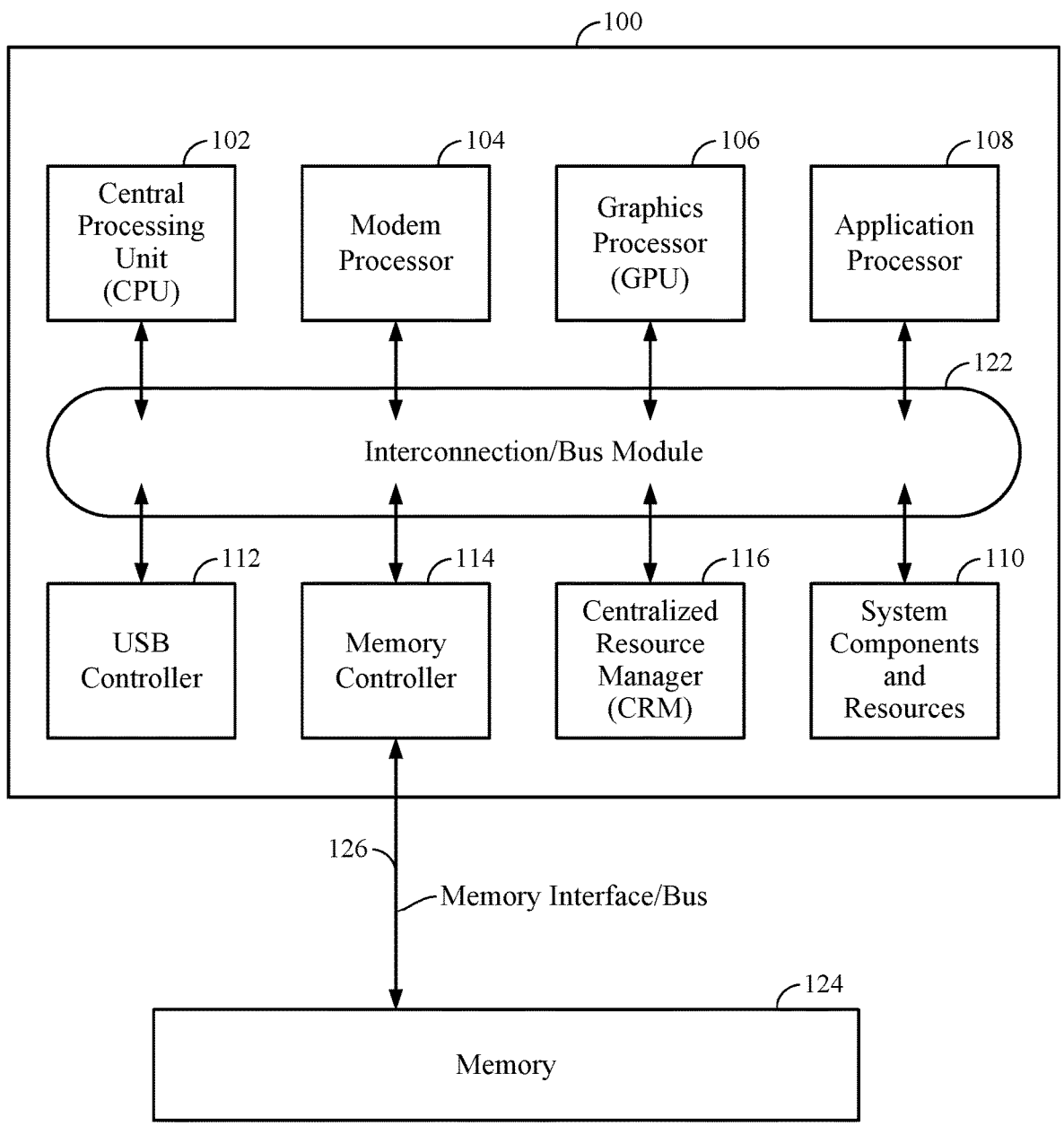
FIG. 1 is an illustration of an exemplary system-on-chip (SoC) integrated circuit design, in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

The various aspects will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

The terms "computing device" and "mobile device" are used interchangeably herein to refer to any one or all of servers, personal computers, smartphones, cellular telephones, tablet computers, laptop computers, netbooks, ultrabooks, palm-top computers, personal data assistants (PDAs), wireless electronic mail receivers, multimedia Internet enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors, modem processors, video processors, etc.), memory blocks (e.g., ROM, RAM, Flash, etc.), and resources (e.g., timers, voltage regulators, oscillators, etc.), any or all of which may be included in one or more cores.

A number of different types of memories and memory technologies are available or contemplated in the future, all of which are suitable for use with the various aspects of the present disclosure. Such memory technologies/types include dynamic random-access memory (DRAM), static random-access memory (SRAM), non-volatile random-access memory (NVRAM), flash memory (e.g., embedded multimedia card (eMMC) flash), pseudostatic random-access memory (PSRAM), double data rate synchronous dynamic random-access memory (DDR SDRAM), and other random-access memory (RAM) and read-only memory (ROM) technologies known in the art. A DDR SDRAM memory may be a DDR type 1 SDRAM memory, DDR type 2 SDRAM memory, DDR type 3 SDRAM memory, or a DDR type 4 SDRAM memory. Each of the above-mentioned memory technologies includes, for example, elements suitable for storing instructions, programs, control signals, and/or data for use in or by a computer or other digital electronic device. Any references to terminology and/or technical details related to an individual type of memory, interface, standard or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

FIG. 1 illustrates example components and interconnections in a system-on-chip (SoC) 100 suitable for implementing various aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock-rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture (e.g., CoreConnect, AMBA, etc.). Communications may also be provided by advanced interconnects, such as high performance networks-on-chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously.

The memory controller 114 may be a specialized hardware module configured to manage the flow of data to and from a memory 124 (e.g., eMMC flash memory) via a memory interface/bus 126. For example, the memory controller 114 may comprise one or more processors configured to perform operations disclosed herein. Examples of processors include microprocessors, microcontrollers, digital signal processors (DSPs), field-programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100. In certain aspects, the memory 124 may be implemented as an SRAM and may include a boost generation circuit as described in more detail herein.

Example Boost Generation Circuits

Figure 2A:
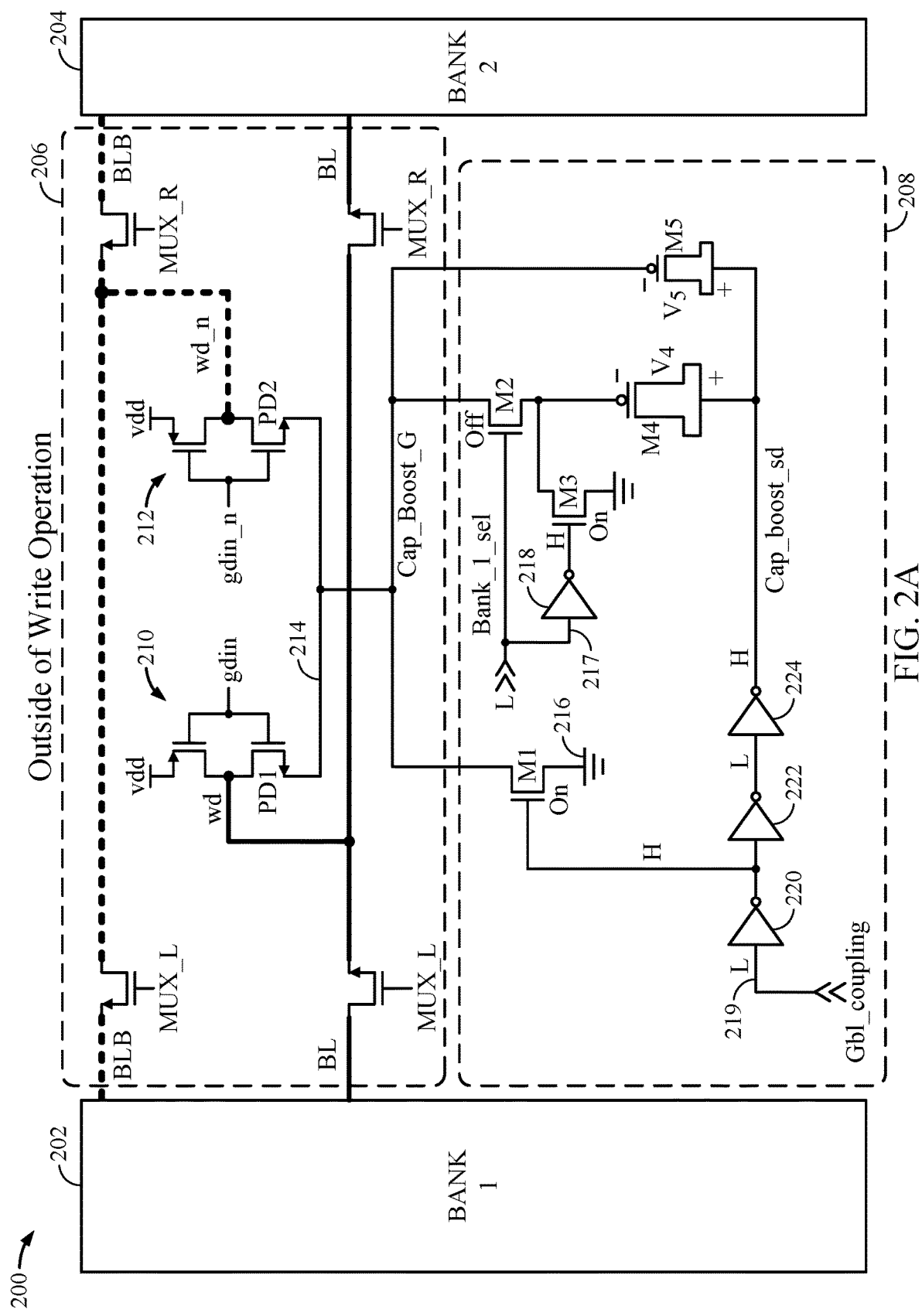
FIG. 2A is a schematic diagram of an example memory circuit having unequally sized memory banks and an example boost generation circuit, illustrating the logic and switch states of the boost generation circuit outside of a write operation.

FIG. 2A is a schematic diagram of an example memory circuit 200, which may be, for example an SRAM or implemented in the memory 124 of FIG. 1. As illustrated in FIG. 2A, the memory circuit 200 includes two memory banks 202, 204 (labeled "Bank 1" and "Bank 2"), a write circuit 206, and a boost generation circuit 208. The memory banks 202, 204 may have unequal sizes. For example, Bank 1 may be larger than Bank 2. The write circuit 206 may include bitline BL and complementary bitline BLB for writing data to the memory banks, based on the multiplexed signals MUX_L and MUX_R. The write circuit 206 may include push-pull inverters 210, 212 (e.g., CMOS logic inverters, which are labeled as write drivers PD1 and PD2), which may be tied to a common reference potential node 214 for the write circuit. As will be described in greater detail below, the reference potential node 214 may be connected to a reference potential node for the memory circuit 200 (e.g., electrical ground 216) or may have a negative potential applied thereto (e.g., negative with respect to the reference potential node for the memory circuit). The purpose of the boost generation circuit 208 is to generate this negative potential (also referred to as a negative boost) for use, for example, during write operations of the memory circuit 200 using the write circuit 206.

As illustrated in FIG. 2A, the boost generation circuit 208 includes a Cap_Boost_G node coupled to the reference potential node 214 of the write circuit 206 and multiple coupling capacitive elements coupled between the Cap_Boost_G node and a Cap_boost_sd node. Because the memory banks are unequal in size, the bank having more memory (e.g., Bank 1) will have a longer bitline than the other bank (e.g., Bank 2), leading to a greater bitline capacitance (Cbl). A higher bitline capacitance results in a larger coupling capacitance (Cc) being specified to generate a more negative boost. Therefore, the multiple coupling capacitive elements may have different capacitances, such as a larger capacitance for Bank 1 and a smaller capacitance being used for Bank 2.

The coupling capacitive elements may be implemented using transistors. For example, p-type metal-oxide semiconductor (PMOS) transistors (e.g., transistors M4 and M5) may be used in which the source and drain are connected together as one terminal of the capacitive element and in which the gate functions as the other terminal. The boost generation circuit 208 may also include a switch coupled between the Cap_Boost_G node and the reference potential node for the memory circuit 200 (e.g., electrical ground 216). As illustrated in FIG. 2A, this switch may be implemented by n-type metal-oxide semiconductor (NMOS) transistor M1). The capacitive element implemented by transistor M5 may be coupled (directly) between the Cap_Boost_G node and the Cap_boost_sd node. The capacitive element implemented by transistor M4 may be coupled (directly) to the Cap_boost_sd node, but may be coupled to the Cap_Boost_G node via a switch. As depicted in FIG. 2A, this switch may be implemented by an NMOS transistor M2, and operation of this switch may be controlled by a control signal labeled "Bank_1_sel" for selecting between Bank 1 and Bank 2. Another switch may be coupled between the gate of transistor M4 (or an equivalent node between the switch implemented by transistor M2 and the capacitive element implemented by transistor M4) and the reference potential node for the memory circuit (e.g., electrical ground 216). As shown in FIG. 2A, this switch may be implemented by an NMOS transistor M3 and may be controlled by the output of an inverter 218 (also referred to as a logical inverter or an inverting circuit) having an input coupled to the Bank_1_sel signal. In this manner, the switch implemented by transistor M2 and the switch implemented by transistor M3 are configured to have opposite states. In other words, when the switch implemented by transistor M2 is closed (e.g., transistor M2 is on), the switch implemented by transistor M3 is open (e.g., transistor M3 is off), and vice versa.

The boost generation circuit 208 may also include a series of inverters 220, 222, 224. The first inverter 220 has an input coupled to a control signal labeled "Gbl_coupling." The output of the first inverter 220 is coupled to the input of the second inverter 222 and to a control signal node for the switch implemented by transistor M1 (e.g., the gate of transistor M1). The output of the second inverter 222 is coupled to the input of the third inverter 224, and the output of the third inverter is coupled to the Cap_boost_sd node.

FIG. 2A also illustrates the logic and switch states of the boost generation circuit 208 outside of a write operation (e.g., before the start of a write operation or after a write operation has completed). Outside of a write operation, the Gbl_coupling signal has a logic low level (labeled "L"). Thus, the first inverter 220 output has a logic high level (labeled "H"), and NMOS transistor M1 is on, pulling the Cap_Boost_G node to ground (e.g., 0 V). With the input of the second inverter 222 being H, the output of the second inverter 222 is L, and the output of the third inverter 224 is H (e.g., Vdd or another power supply voltage powering the third inverter). The Bank_1_sel signal is L, such that NMOS transistor M2 is off, and NMOS transistor M3 is on. In this manner, the gate of transistor M4 is pulled to ground, and the source/drain of transistor M4 is charged to a positive potential (e.g., Vdd), equal to the potential of the Cap_boost_sd node. Also, the gate of transistor M5 is pulled to ground (through transistor M1), and the source/drain of transistor M5 is also charged to the positive potential of the Cap_boost_sd node.

Figure 2B:
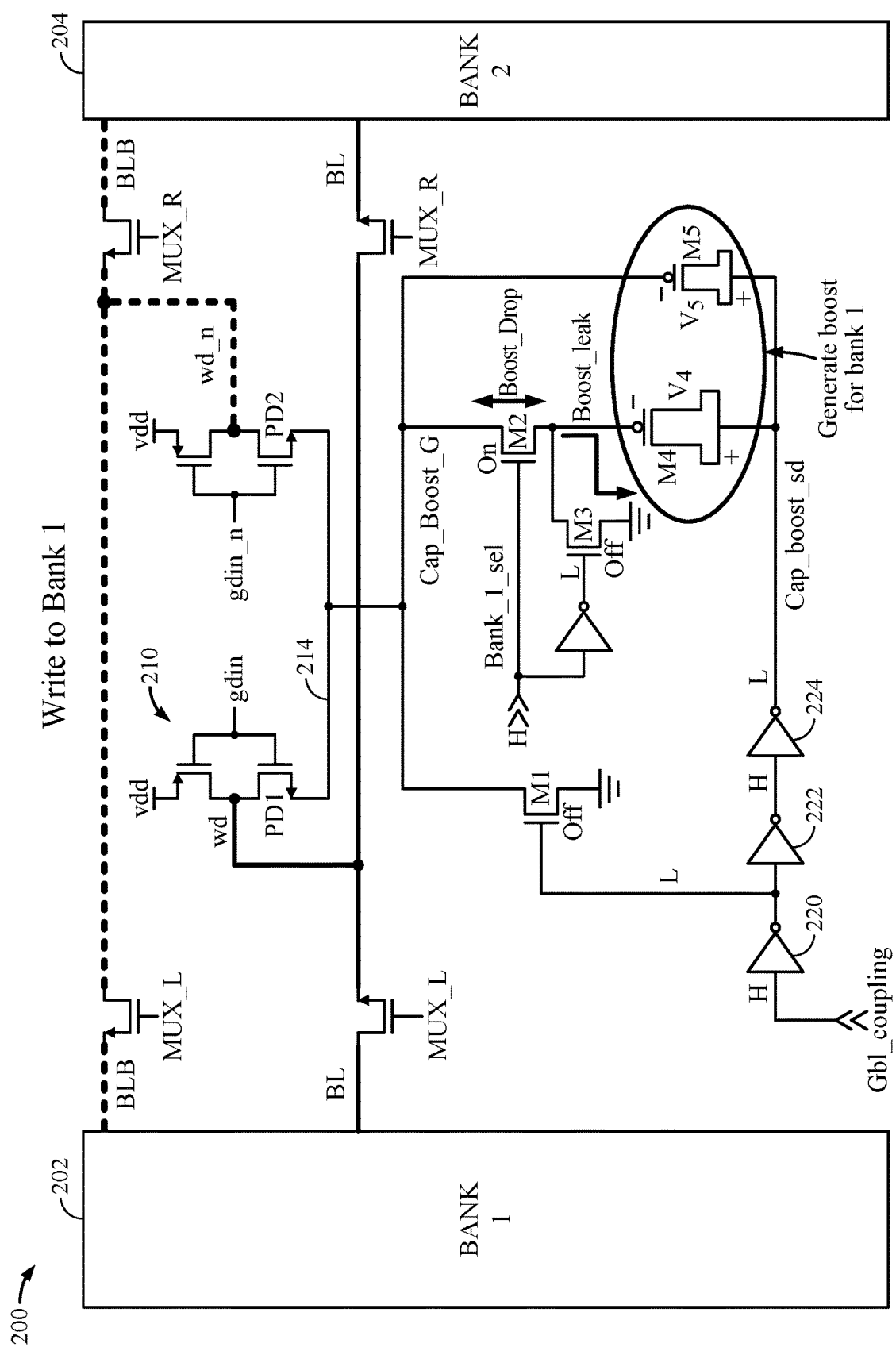
FIG. 2B illustrates the logic and switch states of the boost generation circuit of FIG. 2A during a write operation to Bank 1.

FIG. 2B illustrates the logic and switch states of the boost generation circuit 208 of FIG. 2A during a write operation to Bank 1. In this scenario, the Gbl_coupling signal transitions from a logic low level (L) to a logic high level (H). Consequently, the first inverter 220 output is L, which turns off transistor M1 and disconnects the Cap_Boost_G node from ground. With the input of the second inverter 222 transitioning to L, the output of the second inverter 222 goes to H, and the output of the third inverter 224 and the voltage of the Cap_boost_sd node goes to L (e.g., 0 V). Since the voltage of a capacitive element cannot be instantaneously changed and the voltage at the Cap_boost_sd node is driven to a logic low level (L), the voltage across M5 (being higher at the source/drain of transistor M5 than at the gate of transistor M5 outside of the write operation) generates a negative boost voltage at the Cap_Boost_G node. Further during the write operation to Bank 1, the Bank_1_sel signal transitions from L to H, thereby turning on transistor M2 and turning off transistor M3. Therefore, the node between the gate of transistor M4 and transistor M2 is disconnected from ground. Since the voltage of a capacitive element cannot be instantaneously changed and the voltage at the Cap_boost_sd node is driven to L, the voltage across M4 (being higher at the source/drain of transistor M4 than at the gate of transistor M4 outside of the write operation) creates a negative potential at the gate of transistor M4, which is transferred to the Cap_Boost_G node through the switch implemented by transistor M2.

In this manner, both capacitances of transistors M4 and M5 contribute to the generation of the boost voltage for the write operation to Bank 1. This negative boost voltage pulls down the reference potential node 214 for the write circuit 206, thereby increasing the voltage swing for the push-pull inverter 210 and increasing the write yield compared to leaving the reference potential node 214 at 0 V. The negative potential developed at the gate of transistor M5 is transferred to the Cap_Boost_G node without any reduction. However, due to the on-resistance of transistor M2, the negative potential developed at the gate of transistor M4 will be reduced (i.e., less negative voltage) across transistor M2 when transferred to the Cap_Boost_G node. Furthermore, since transistor M2 is on and transistor M3 is off, a leakage path exists through transistor M3, which will also reduce the negative potential transferred to the Cap_Boost_G node with this topology for the boost generation circuit 208. Therefore, the negative boost voltage seen by the reference potential node 214 of the write circuit 206 may not be as negative as desired (i.e., lower boost voltage).

Figure 2C:
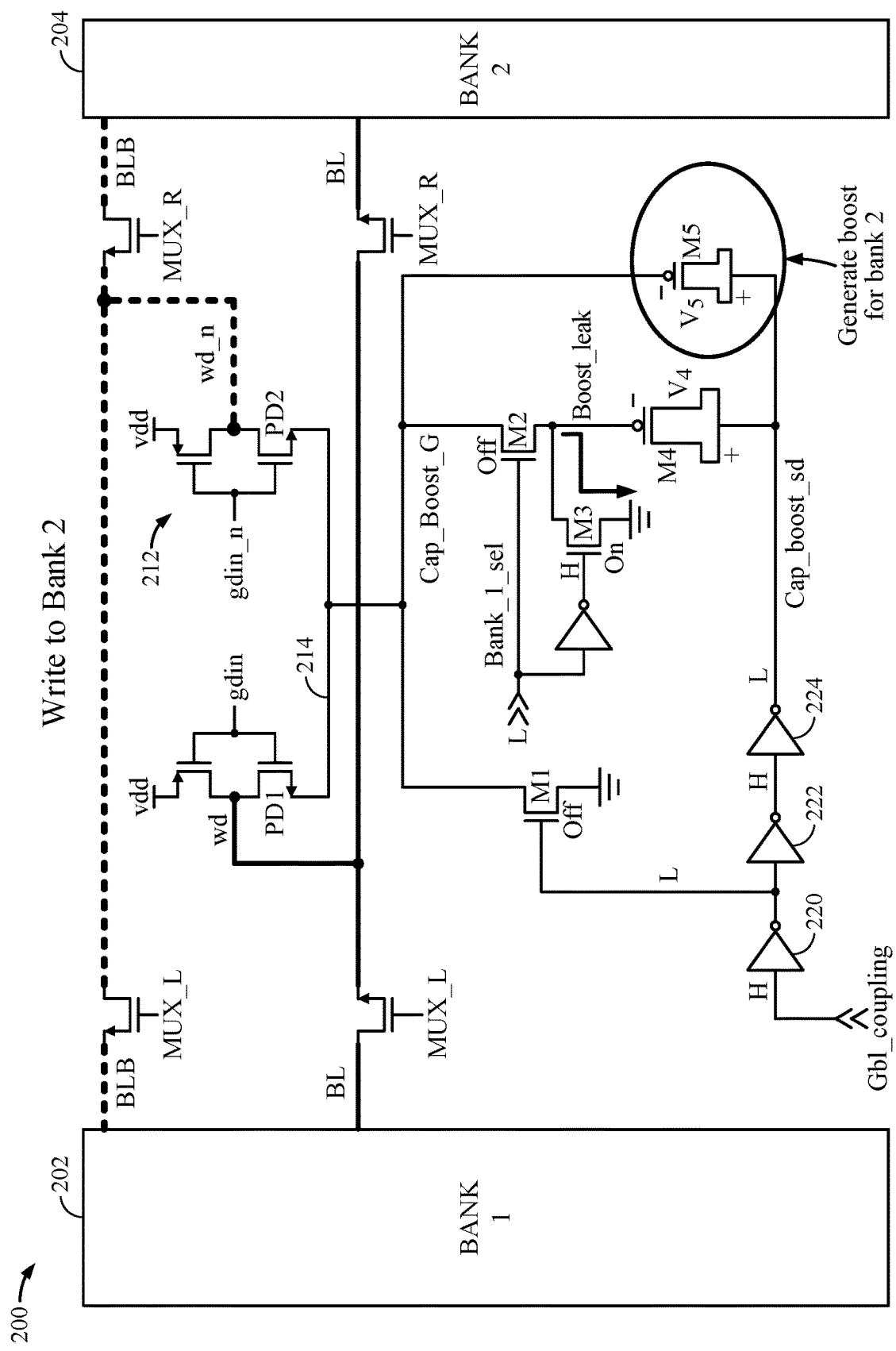
FIG. 2C illustrates the logic and switch states of the boost generation circuit of FIG. 2A during a write operation to Bank 2.

FIG. 2C illustrates the logic and switch states of the boost generation circuit 208 of FIG. 2A during a write operation to Bank 2, starting from the logic and switch states of FIG. 2A outside of a write operation. In this scenario, the Gbl_coupling signal transitions from L to H. Consequently, the first inverter 220 output is L, which turns off transistor M1 and disconnects the Cap_Boost_G node from ground. With the input of the second inverter 222 transitioning to L, the output of the second inverter 222 goes to H, and the output of the third inverter 224 and the voltage of the Cap_boost_sd node goes to L (e.g., 0 V). Since the voltage of a capacitive element cannot be instantaneously changed and the voltage at the Cap_boost_sd node is driven to L, the voltage across M5 (being higher at the source/drain of transistor M5 than at the gate of transistor M5 outside of the write operation) develops a negative potential at the gate of transistor M5. Further during the write operation to Bank 2, the Bank_1_sel signal remains at L, leaving transistor M2 turned off and keeping transistor M3 turned on. Therefore, transistor M4 stays disconnected from the Cap_Boost_G node and does not contribute as a coupling capacitive element during the write operation to Bank 2. In other words, the Bank_1_sel signal controls whether both transistors M4 and M5 contribute to the boost generation (when H) or only transistor M5 (when L).

In this manner, the capacitance of transistor M5 contributes to the generation of the boost voltage for the write operation to Bank 2, without the contribution of transistor M4. This negative boost voltage pulls down the reference potential node 214 for the write circuit 206, thereby increasing the voltage swing for the push-pull inverter 212 and increasing the write yield compared to leaving the reference potential node 214 at 0 V. However, since transistor M2 is off, a leakage path exists through transistors M2 and M3, which reduces the negative potential transferred from the gate of transistor M5 to the Cap_Boost_G node with this topology for the boost generation circuit 208. Therefore, the boost voltage seen by the reference potential node 214 of the write circuit 206 could potentially be even greater (i.e., more negative) without such a leakage path. Such a leakage path reduces the boost generation efficiency, which in turn decreases the write yield for the memory circuit 200.

Figure 3:
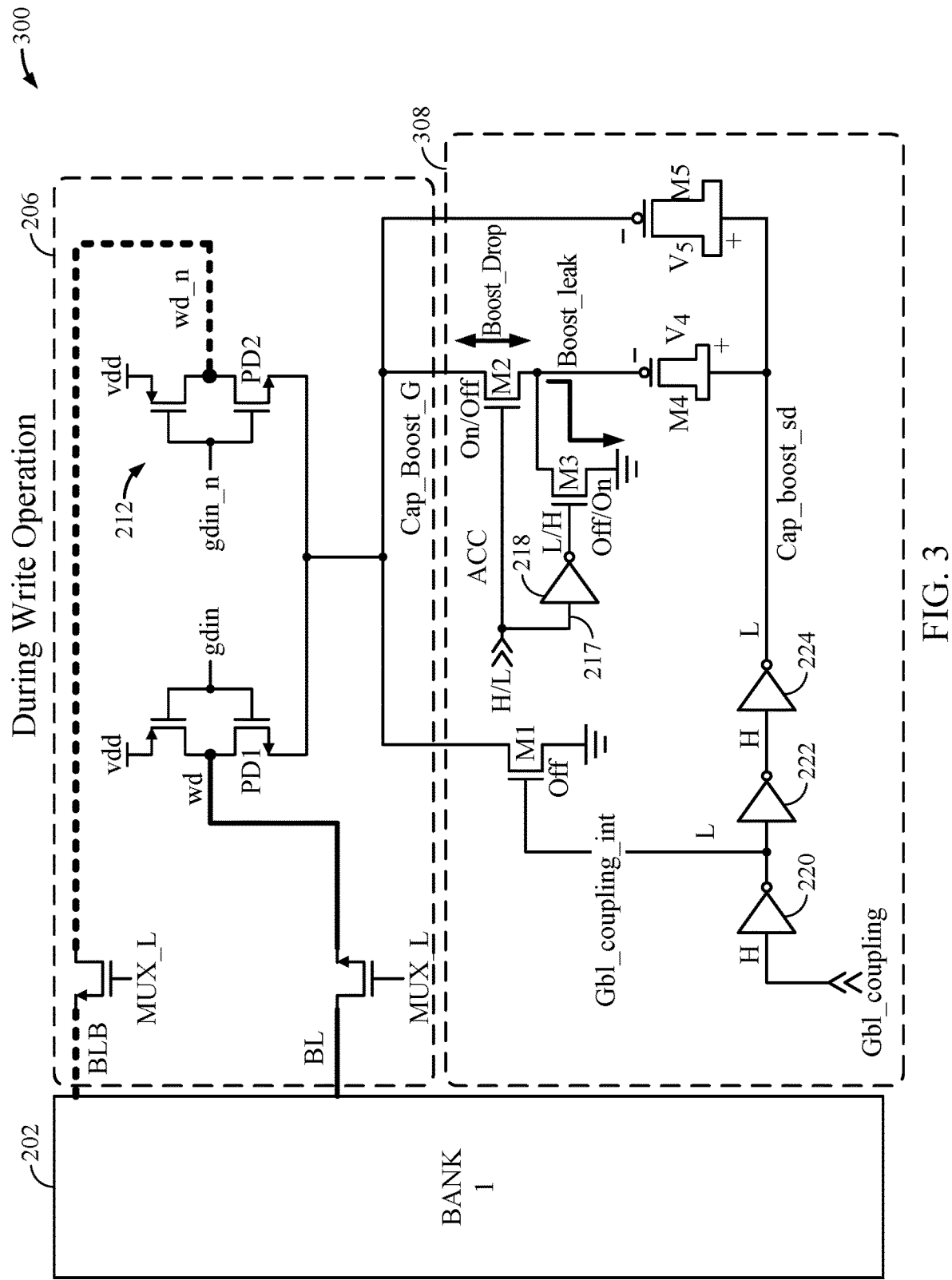
FIG. 3 is a schematic diagram of an example memory circuit having an example boost generation circuit controlled by an alternating-current-coupled (ACC) bit, illustrating the logic and switch states of the boost generation circuit based on both states of the ACC bit.

FIG. 3 is a schematic diagram of an example memory circuit 300 having an example boost generation circuit 308 controlled by an alternating-current-coupled (ACC) bit. The memory circuit 300 includes a memory bank 202 (labeled "Bank 1"), a write circuit 206, and a boost generation circuit 308. The boost generation circuit 308 of FIG. 3 has the same components and circuit topology as the boost generation circuit 208 of FIGS. 2A-2C, but the Bank_1_sel signal is replaced by an ACC signal controlling the operation of the switch implemented by transistor M2 and the switch operated by transistor M3 via inverter 218.

FIG. 3 also illustrates the logic and switch states of the boost generation circuit 308 based on both states of the ACC bit. The operation of the memory circuit 300 outside of a write operation is similar to the operation of the memory circuit 200 outside of a write operation as described in association with FIG. 2A and will not be repeated here, with the exception of noting the ACC bit is at a logic low level (L) outside of the write operation. Since the ACC bit functions similar to the Bank_Sel_1 signal, the reader can refer to the description of FIGS. 2B and 2C above and substitute the ACC signal for the Bank_Sel_1 signal to understand the operation of the boost generation circuit 308 during write operations. The boost generation circuit 308 also has the same problems with boost drop and boost leakage as the boost generation circuit 208. In other words, if the ACC signal is H during a write operation, the negative potential generated at the gate of transistor M4 will not be effectively transferred to the Cap_Boost_G node, due to the voltage drop across transistor M2 and the leakage through transistor M3. In the case where the ACC signal is L during a write operation, the negative potential generated at the gate of transistor M5 will not be effectively transferred to the Cap_Boost_G node, due to the leakage path through transistors M2 and M3.

Example Boost Generation Circuits with More Negative Boost Voltage

Certain aspects of the present disclosure provide alternative circuit topologies for a boost generation circuit that avoid the boost drop and boost leakage problems above, thereby generating a more negative boost voltage for the reference potential node of the write circuit. By generating a more negative boost voltage, write yield may be increased across a compiler range. Furthermore, such alternative circuit topologies may provide this more negative boost voltage without significantly impacting area, power, or performance of the memory circuits.

Figure 4A:
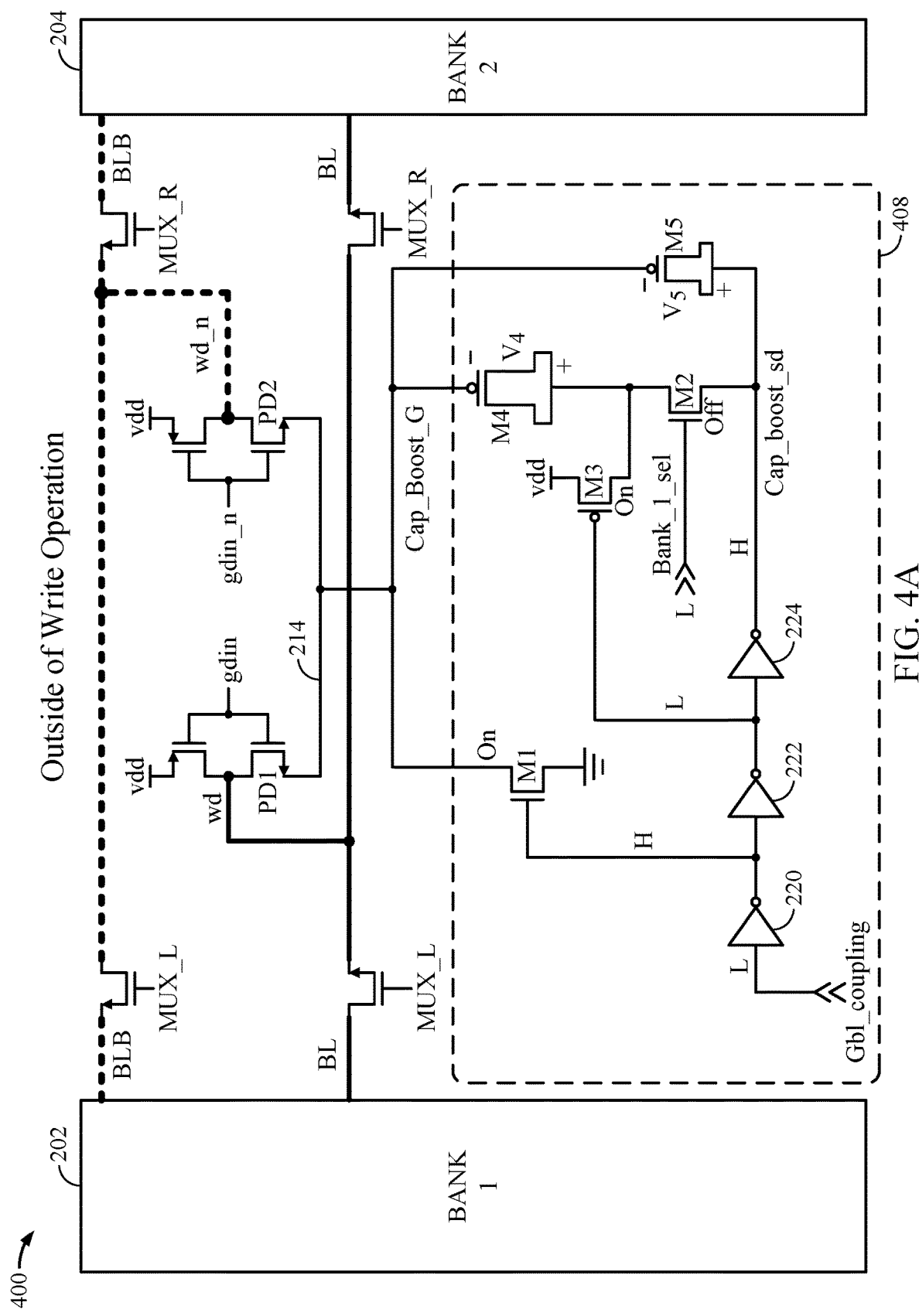
FIG. 4A is a schematic diagram of an example memory circuit having unequally sized memory banks and an example boost generation circuit with a different circuit topology and lower leakage than the circuit of FIGS. 2A-2C, illustrating the logic and switch states of the boost generation circuit outside of a write operation, in accordance with certain aspects of the present disclosure.

FIG. 4A is a schematic diagram of an example memory circuit 400 having unequally sized memory banks 202, 204 (labeled "Bank 1" and "Bank 2") and an example boost generation circuit 408 with a different circuit topology and lower leakage than the boost generation circuit 208 of FIGS. 2A-2C, in accordance with certain aspects of the present disclosure. The boost generation circuit 408 of FIG. 4A has similar components as the boost generation circuit 208 of FIGS. 2A-2C. However, the gate of PMOS transistor M4 is coupled (in some cases directly coupled) to the Cap_Boost_G node, and the switch implemented by transistor M2 is coupled between the source/drain of transistor M4 and the Cap_boost_sd node. Furthermore, the drain of transistor M3 is coupled to a power supply rail (e.g., Vdd), the source of transistor M3 is coupled to the source/drain of transistor M4 and the drain of transistor M2, and the gate of transistor M3 is coupled to the output of the second inverter 222. The benefit of this change in circuit topology is seen during the write operation and will be explained in the description of FIGS. 4B and 4C.

FIG. 4A illustrates the logic and switch states of the boost generation circuit 408 outside of a write operation (e.g., before the start of a write operation or after a write operation has completed), and is very similar to the logic and switch states of the boost generation circuit 208 in FIG. 2A. Outside of a write operation, the Gbl_coupling signal has a logic low level (L). Thus, the first inverter 220 output has a logic high level (H), and NMOS transistor M1 is on, pulling the Cap_Boost_G node to ground (e.g., 0 V). With the input of the second inverter 222 being H, the output of the second inverter 222 is L, and the output of the third inverter 224 is H (e.g., Vdd or another power supply voltage powering the third inverter). Therefore, transistor M3 is on, and with the Bank_1_sel signal being L, transistor M2 is off. In this manner, the gate of transistor M4 is pulled to ground via transistor M1, and the source/drain of transistor M4 is charged to a positive potential (e.g., Vdd) via transistor M3. Also, the gate of transistor M5 is pulled to ground (through transistor M1), and the source/drain of transistor M5 is also charged to a positive potential (e.g., Vdd) of the Cap_boost_sd node.

Figure 4B:
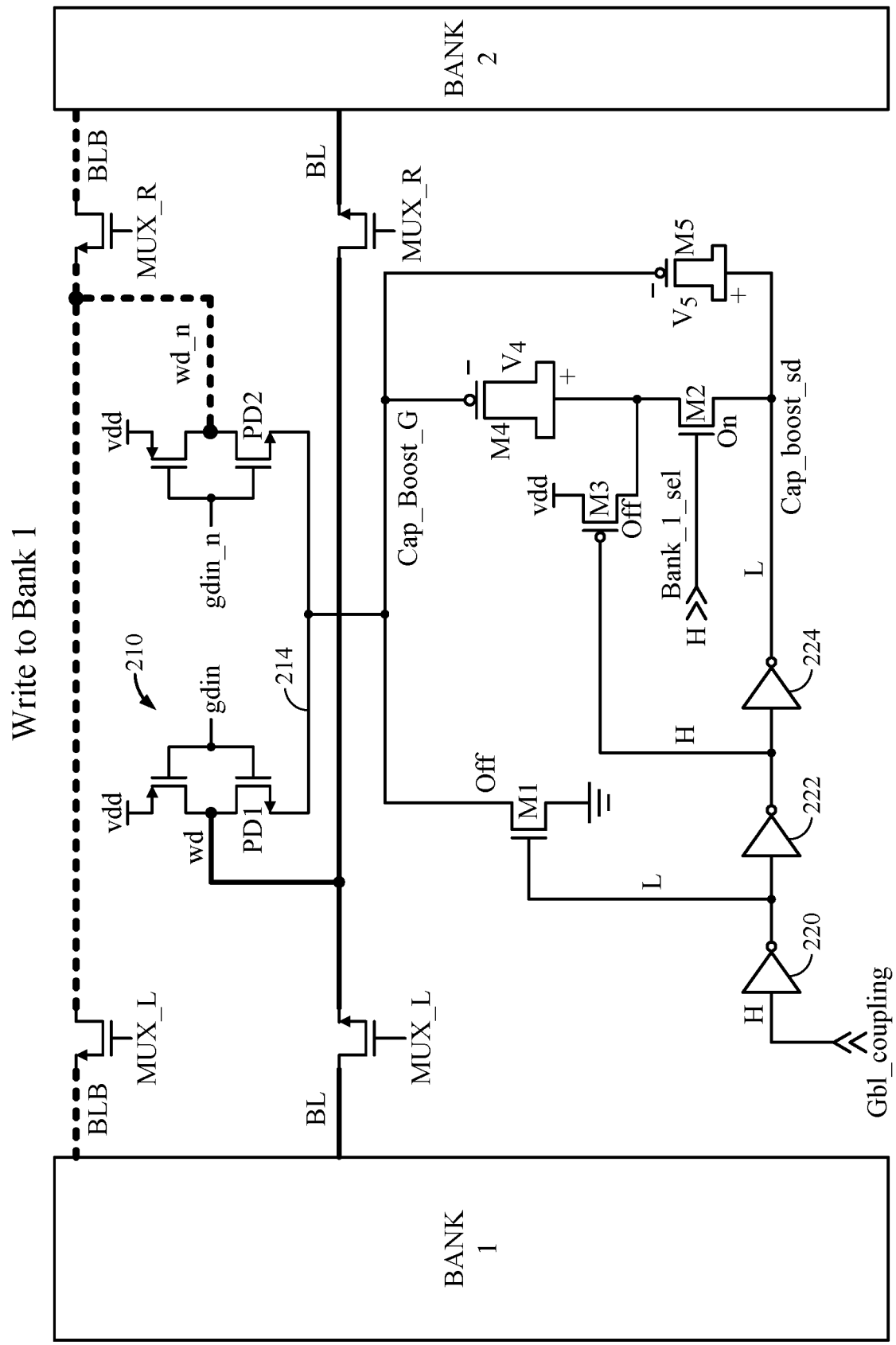
FIG. 4B illustrates the logic and switch states of the boost generation circuit of FIG. 4A during a write operation to Bank 1.

FIG. 4B illustrates the logic and switch states of the boost generation circuit 408 of FIG. 4A during a write operation to Bank 1, in accordance with aspects of the present disclosure. Many aspects of this write operation to Bank 1 are similar to the write operation described with respect to FIG. 2B. In this scenario, the Gbl_coupling signal transitions from a logic low level (L) to a logic high level (H). Consequently, the first inverter 220 output transitions to L, which turns off transistor M1 and disconnects the Cap_Boost_G node from ground. With the input of the second inverter 222 transitioning to L, the output of the second inverter 222 goes to H, and the output of the third inverter 224 and the voltage of the Cap_boost_sd node goes to L (e.g., 0 V). Therefore, transistor M3 turns off, such that the source/drain of transistor M4 is disconnected from Vdd. Further during the write operation to Bank 1, the Bank_1_sel signal transitions from L to H, thereby turning on transistor M2. Since the voltage of a capacitive element cannot be instantaneously changed and the voltage at the Cap_boost_sd node is driven to L (e.g., 0 V), the voltage across M5 (being higher at the source/drain of transistor M5 than at the gate of transistor M5 outside of the write operation) generates a negative boost voltage at the Cap_Boost_G node. For similar reasons, the voltage across M4 (being higher at the source/drain of transistor M4 than at the gate of transistor M4 outside of the write operation) creates a negative potential at the gate of transistor M4, which is transferred to the Cap_Boost_G node.

In this manner, both capacitances of transistors M4 and M5 contribute to the generation of the boost voltage for the write operation to Bank 1. This negative boost voltage pulls down the reference potential node 214 for the write circuit 206, thereby increasing the voltage swing for the push-pull inverter 210 and increasing the write yield compared to leaving the reference potential node 214 at 0 V. The negative potentials developed at the gates of transistors M4 and M5 are transferred to the Cap_Boost_G node without any reduction, since there are no components (e.g., transistors) introducing a boost voltage drop or leakage paths between the Cap_Boost_G node and the gates of transistors M4 and M5. Therefore, the negative boost voltage seen by the reference potential node 214 of the write circuit 206 can be the same as the negative potentials generated at the gates of transistors M4 and M5. Consequently, the write yield achieved by the boost generation circuit 408 may be increased compared to the write yield achieved by the boost generation circuit 208 during the write operation to Bank 1.

Figure 4C:
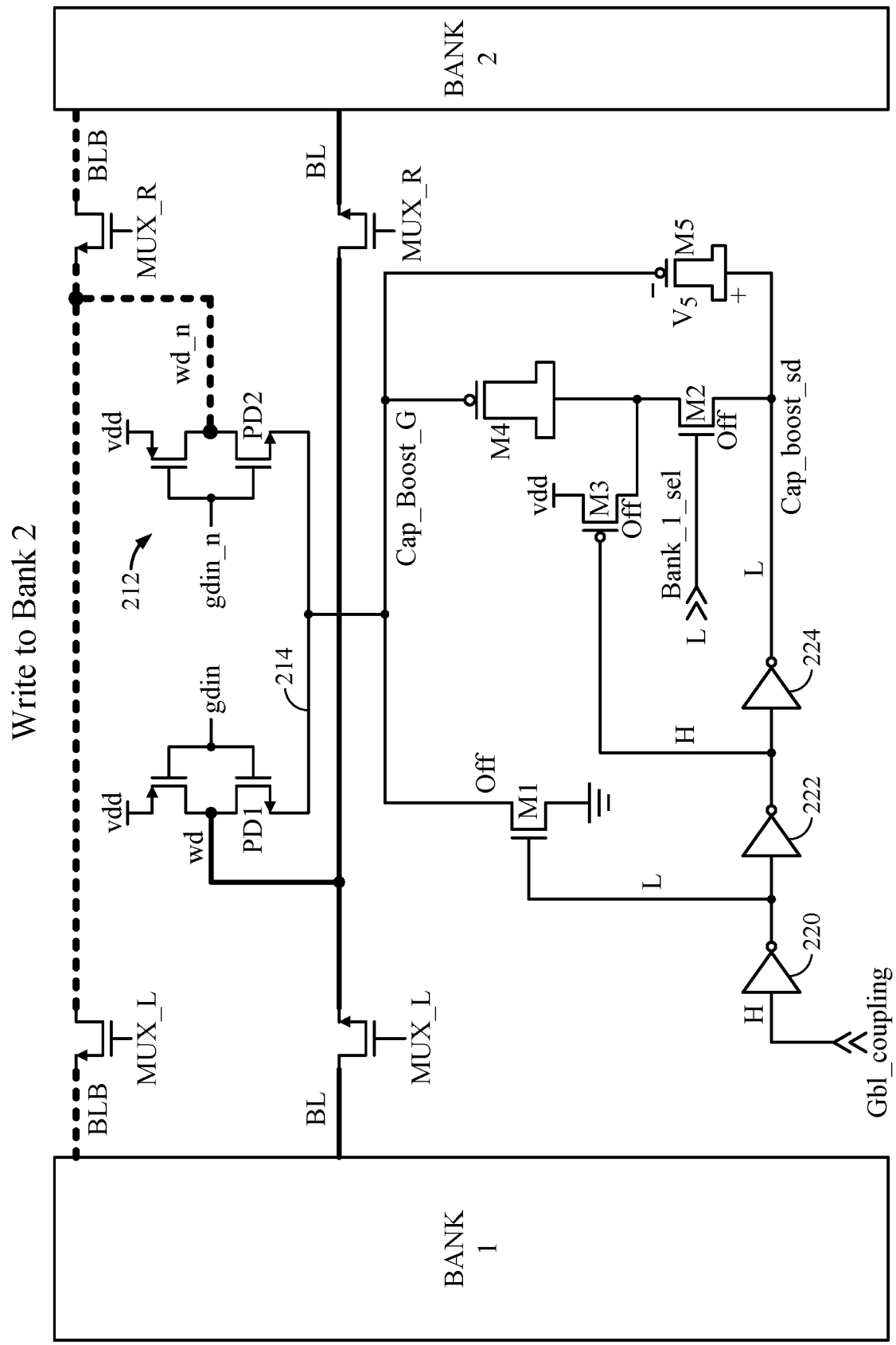
FIG. 4C illustrates the logic and switch states of the boost generation circuit of FIG. 4A during a write operation to Bank 2.

FIG. 4C illustrates the logic and switch states of the boost generation circuit 408 of FIG. 4A during a write operation to Bank 2, starting from the logic and switch states of FIG. 4A outside of a write operation, in accordance with aspects of the present disclosure. Many aspects of this write operation to Bank 2 are similar to the write operation described with respect to FIG. 2C. In this scenario, the Gbl_coupling signal transitions from L to H. Consequently, the first inverter 220 output is L, which turns off transistor M1 and disconnects the Cap_Boost_G node from ground. With the input of the second inverter 222 transitioning to L, the output of the second inverter 222 goes to H, and the output of the third inverter 224 and the voltage of the Cap_boost_sd node goes to L (e.g., 0 V). Therefore, transistor M3 turns off, such that the source/drain of transistor M4 is disconnected from Vdd. Since the voltage of a capacitive element cannot be instantaneously changed and the voltage at the Cap_boost_sd node is driven to L, the voltage across transistor M5 (being higher at the source/drain of transistor M5 than at the gate of transistor M5 outside of the write operation) develops a negative potential at the gate of transistor M5. Further during the write operation to Bank 2, the Bank_1_sel signal remains at L, leaving transistor M2 turned off. Therefore, transistor M4 stays disconnected from the Cap_Boost_G node and does not contribute as a coupling capacitive element during the write operation to Bank 2. In other words, the Bank_1_sel signal controls whether both transistors M4 and M5 contribute to the boost generation (when H) or only transistor M5 (when L).

In this manner, the capacitance of transistor M5 contributes to the generation of the boost voltage for the write operation to Bank 2, without the contribution of transistor M4. This negative boost voltage pulls down the reference potential node 214 for the write circuit 206, thereby increasing the voltage swing for the push-pull inverter 212 and increasing the write yield compared to leaving the reference potential node 214 at 0 V. Furthermore, since the gate of transistor M4 is coupled (directly) to the Cap_Boost_G node, there is no leakage path to reduce the negative potential generated at the gate of transistor M5 from being completely transferred to the Cap_Boost_G node with this topology for the boost generation circuit 408. Therefore, the negative boost voltage seen by the reference potential node 214 of the write circuit 206 can be the same as the negative potential generated at the gate of transistor M5. Consequently, the write yield achieved by the boost generation circuit 408 may be increased compared to the write yield achieved by the boost generation circuit 208 during the write operation to Bank 2.

Figure 5:
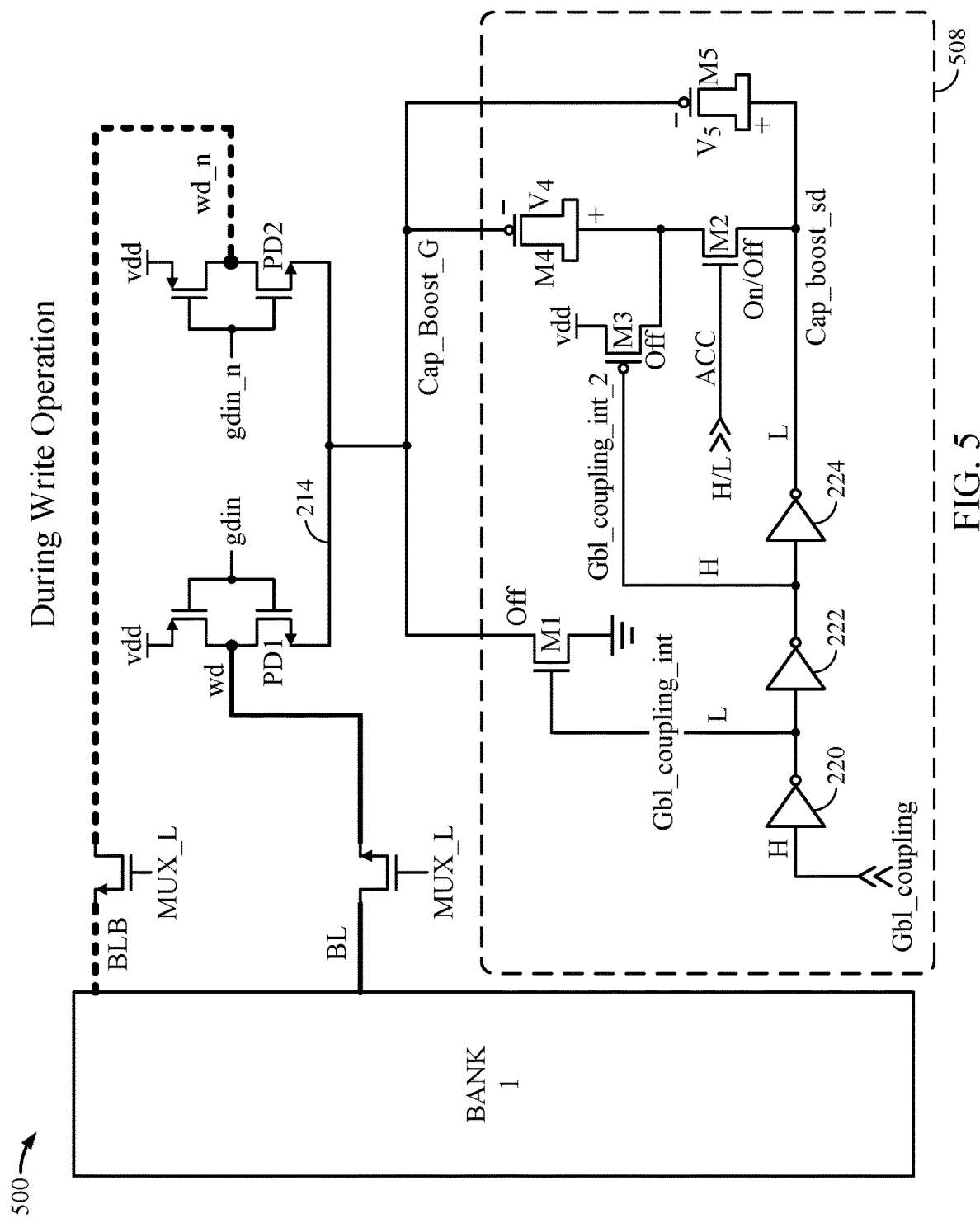
FIG. 5 is a schematic diagram of an example memory circuit having an example boost generation circuit controlled by an ACC bit with a different circuit topology and lower leakage than the circuit of FIG. 3, illustrating the logic and switch states of the boost generation circuit based on both states of the ACC bit, in accordance with certain aspects of the present disclosure.

FIG. 5 is a schematic diagram of an example memory circuit 500 having an example boost generation circuit controlled by an ACC bit with a different circuit topology and lower leakage than the circuit of FIG. 3, in accordance with certain aspects of the present disclosure. The memory circuit 500 includes a memory bank 202 (labeled "Bank 1"), a write circuit 206, and a boost generation circuit 508. The boost generation circuit 508 of FIG. 5 has the same components and circuit topology as the boost generation circuit 408 of FIGS. 4A-4C, but the Bank_1_sel signal is replaced by an ACC signal controlling the operation of the switch implemented by transistor M2.

FIG. 5 also illustrates the logic and switch states of the boost generation circuit 508 based on both states of the ACC bit. The operation of the memory circuit 500 outside of a write operation is similar to the operation of the memory circuit 400 outside of a write operation as described in association with FIG. 4A and will not be repeated here, with the exception of noting the ACC bit is at a logic low level (L) outside of the write operation. Since the ACC bit functions similar to the Bank_Sel_1 signal, the reader can refer to the description of FIGS. 4B and 4C above and substitute the ACC signal for the Bank_Sel_1 signal to understand the operation of the boost generation circuit 508 during write operations. The boost generation circuit 508 also has the same improvements as the boost generation circuit 408. In other words, if the ACC signal is H during a write operation, the negative potential generated at the gate of transistor M4 may be completely transferred to the Cap_Boost_G node without any loss, due to the absence of any voltage drop or leakage path between the gate of transistor M4 and the Cap_Boost_G node. In the case where the ACC signal is L during a write operation, the negative potential generated at the gate of transistor M5 may be completely transferred to the Cap_Boost_G node without any reduction, due to absence of a leakage path in the branch with transistor M4. In both scenarios, the write yield of the memory circuit 500 may be increased compared to the write yield of the memory circuit 300.

In the circuit topologies of FIGS. 4A-4C and 5, the Cap_boost_sd node transitions from H to L at the start of write operations, which generates a negative potential at the gate of transistor M5. After a finite time due to the transitioning of transistor M2 from off to on, the source/drain of transistor M4 goes to L, which generates a negative potential at the gate of transistor M4. Thus, the generation of the negative potential at the gates of transistors M4 and M5 may not occur simultaneously.

Certain aspects of the present disclosure provide an alternative circuit topology for a boost generation circuit, in which both the sources/drains of transistors M4 and M5 go to L (e.g., 0 V) concurrently, so the negative potentials at the gates are generated at the same time. Concurrent generation of the negative potentials at the gates of transistors M4 and M5 may ensure that both transistors M4 and M5 are contributing to the boost voltage, without any extra coupling between M4 and M5. In both schemes, however, there may be no reduction in boost voltage between the gates of transistors M4 and M5 and the Cap_Boost_G node (and consequently, the reference potential node 214 for the write circuit.

Figure 6A:
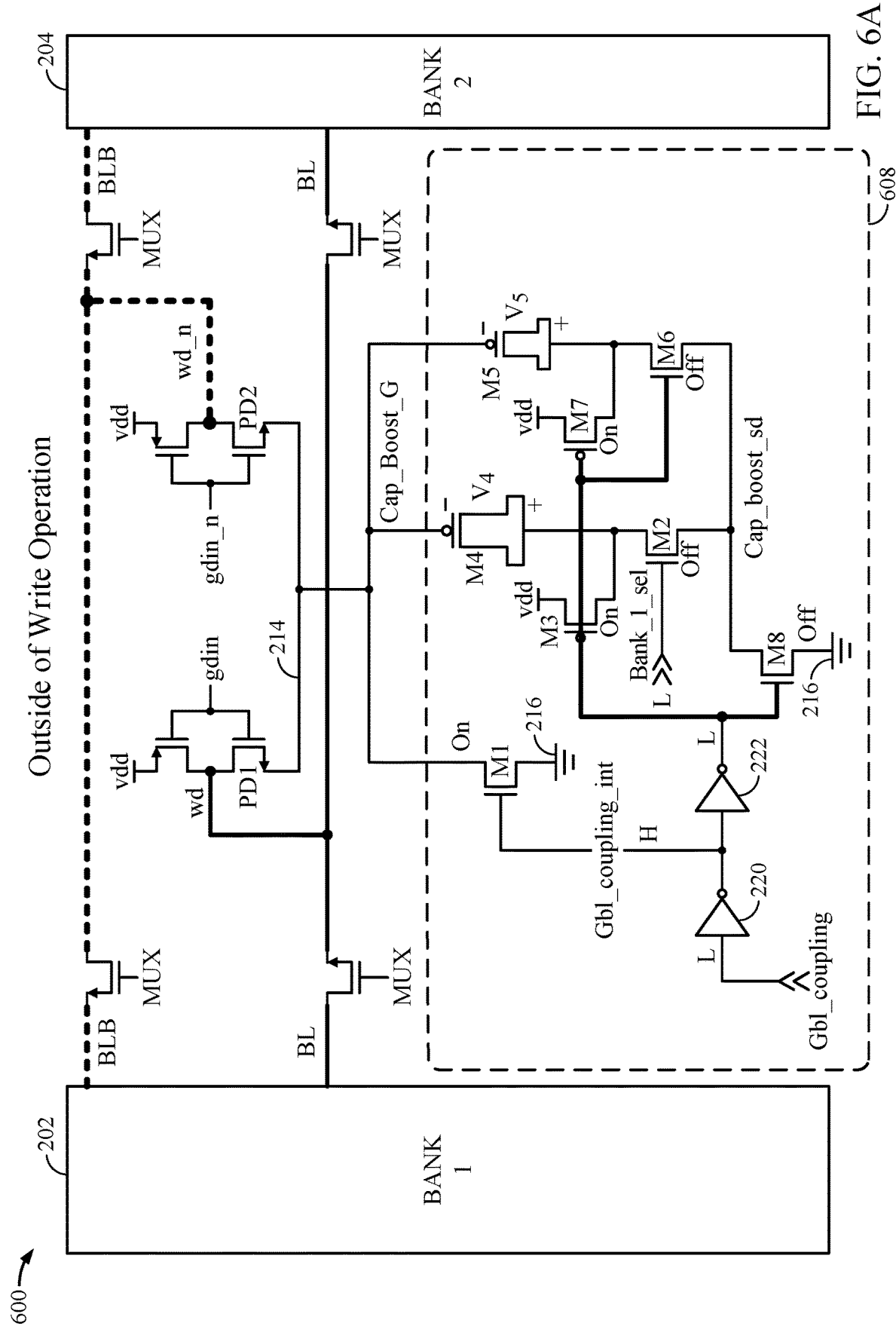
FIG. 6A is a schematic diagram of an example memory circuit having unequally sized memory banks and another example boost generation circuit with a different circuit topology and lower leakage than the circuit of FIGS. 2A-2C, illustrating the logic and switch states of the boost generation circuit outside of a write operation, in accordance with certain aspects of the present disclosure.

FIG. 6A is a schematic diagram of an example memory circuit 600 having unequally sized memory banks 202, 204 (labeled "Bank 1" and "Bank 2") and an example boost generation circuit 608 with a different circuit topology and lower leakage than the boost generation circuit 208 of FIGS. 2A-2C, in accordance with certain aspects of the present disclosure.

The boost generation circuit 608 of FIG. 6A has similar components as the boost generation circuit 408 of FIGS. 4A-4C. However, the third inverter 224 is removed, and transistors M6, M7, and M8 have been added. The output of the second inverter 222 is coupled to the gate of PMOS transistor M3, the gate of NMOS transistor M6, the gate of PMOS transistor M7, and the gate of NMOS transistor M8. The drain of transistor M6 is coupled to the source/drain of transistor M5 and to the drain of transistor M7, and the source of transistor M6 is coupled to the Cap_boost_sd node. The source of transistor M7 is coupled to Vdd. The drain of transistor M8 is coupled to the Cap_boost_sd node, and the source of transistor M8 is coupled the reference potential node for the memory circuit 600 (e.g., electrical ground 216). The benefit of this change in circuit topology is seen during the write operation and will be explained in the description of FIGS. 6B and 6C.

FIG. 6A illustrates the logic and switch states of the boost generation circuit 608 outside of a write operation (e.g., before the start of a write operation or after a write operation has completed). Outside of a write operation, the Gbl_coupling signal has a logic low level (L). Thus, the first inverter 220 output has a logic high level (H), and NMOS transistor M1 is on, pulling the Cap_Boost_G node to ground (e.g., 0 V). With the input of the second inverter 222 being H, the output of the second inverter 222 is L. Therefore, transistors M3 and M7 are on, while transistors M6 and M8 are off. With the Bank_1_sel signal being L, transistor M2 is also off. In this manner, the gate of transistor M4 is pulled to ground via transistor M1, and the source/drain of transistor M4 is charged to a positive potential (e.g., Vdd) via transistor M3. Also, the gate of transistor M5 is pulled to ground (through transistor M1), and the source/drain of transistor M5 is also charged to a positive potential (e.g., Vdd) via transistor M7. The sources/drains of transistors M4 and M5 are disconnected from the Cap_boost_sd node by transistors M2 and M6, respectively, being off.

Figure 6B:
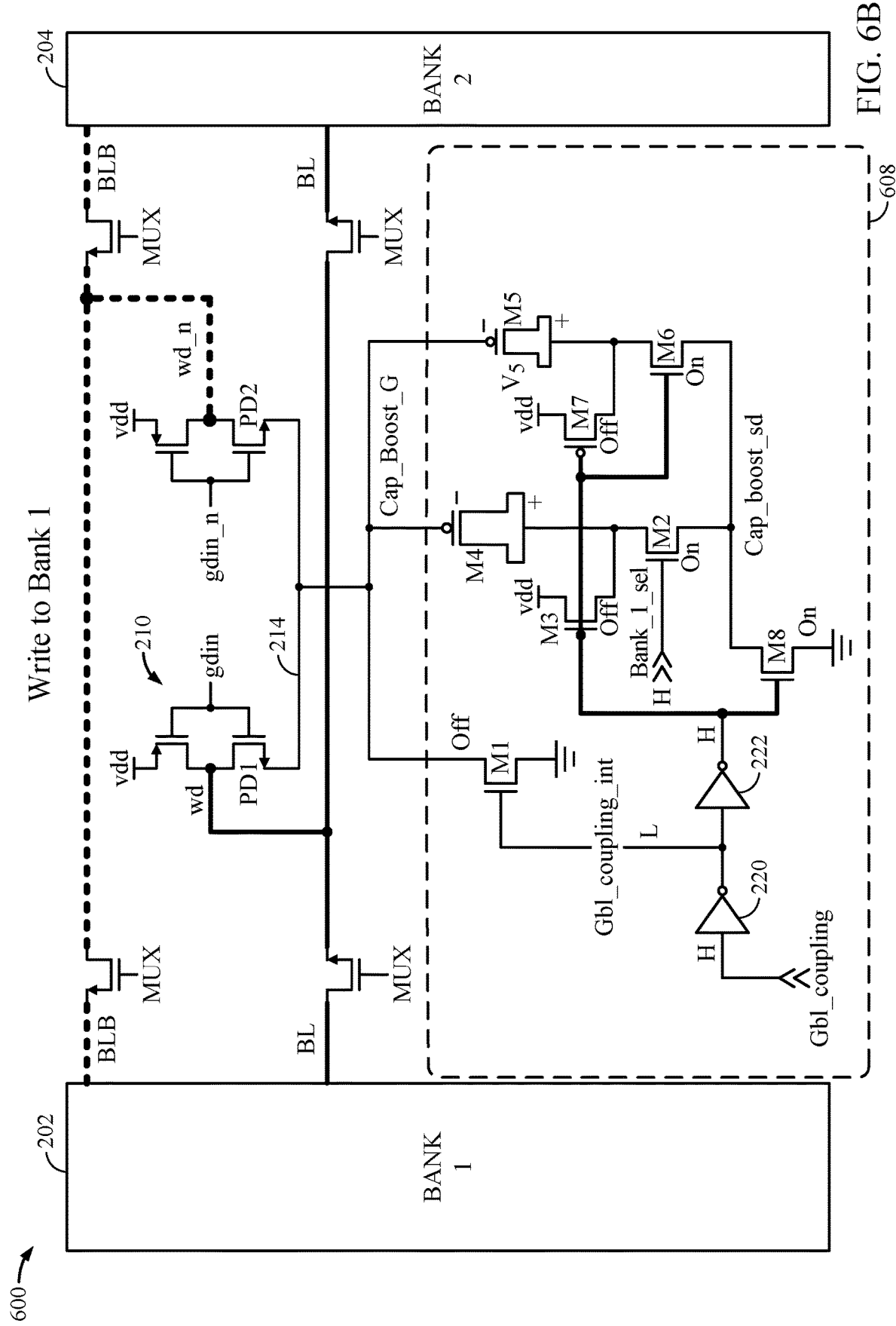
FIG. 6B illustrates the logic and switch states of the boost generation circuit of FIG. 6A during a write operation to Bank 1.

FIG. 6B illustrates the logic and switch states of the boost generation circuit 608 of FIG. 6A during a write operation to Bank 1, in accordance with certain aspects of the present disclosure. In this scenario, the Gbl_coupling signal transitions from a logic low level (L) to a logic high level (H). Consequently, the first inverter 220 output transitions to L, which turns off transistor M1 and disconnects the Cap_Boost_G node from ground. With the input of the second inverter 222 transitioning to L, the output of the second inverter 222 goes to H. Therefore, transistors M3 and M7 turn off, such that the sources/drains of transistors M4 and M5 are disconnected from Vdd. Also with the output of the second inverter 222 transitioning to H, transistors M6 and M8 are turned on, such that the voltage of the Cap_boost_sd node goes to ground (e.g., 0 V) and the source/drain of transistor M5 is connected to the Cap_boost_sd node. Since the voltage of a capacitive element cannot be instantaneously changed and the voltage at the Cap_boost_sd node is driven to L (e.g., 0 V), the voltage across M5 (being higher at the source/drain of transistor M5 than at the gate of transistor M5 outside of the write operation) generates a negative potential at the gate of write transistor M5, which may be completely transferred to the Cap_Boost_G node. Further during the write operation to Bank 1, the Bank_1_sel signal transitions from L to H, thereby turning on transistor M2. For similar reasons as above, the voltage across transistor M4 (being higher at the source/drain of transistor M4 than at the gate of transistor M4 outside of the write operation) creates a negative potential at the gate of transistor M4, which may be completely transferred to the Cap_Boost_G node. If the Bank_1_sel signal transitions from L to H before or simultaneously with the output of the second inverter 222 transitioning from L to H, the negative potentials at the gates of transistors M4 and M5 may be concurrently generated, helping ensure that both transistors M4 and M5 are contributing to the boost voltage.

Figure 6C:
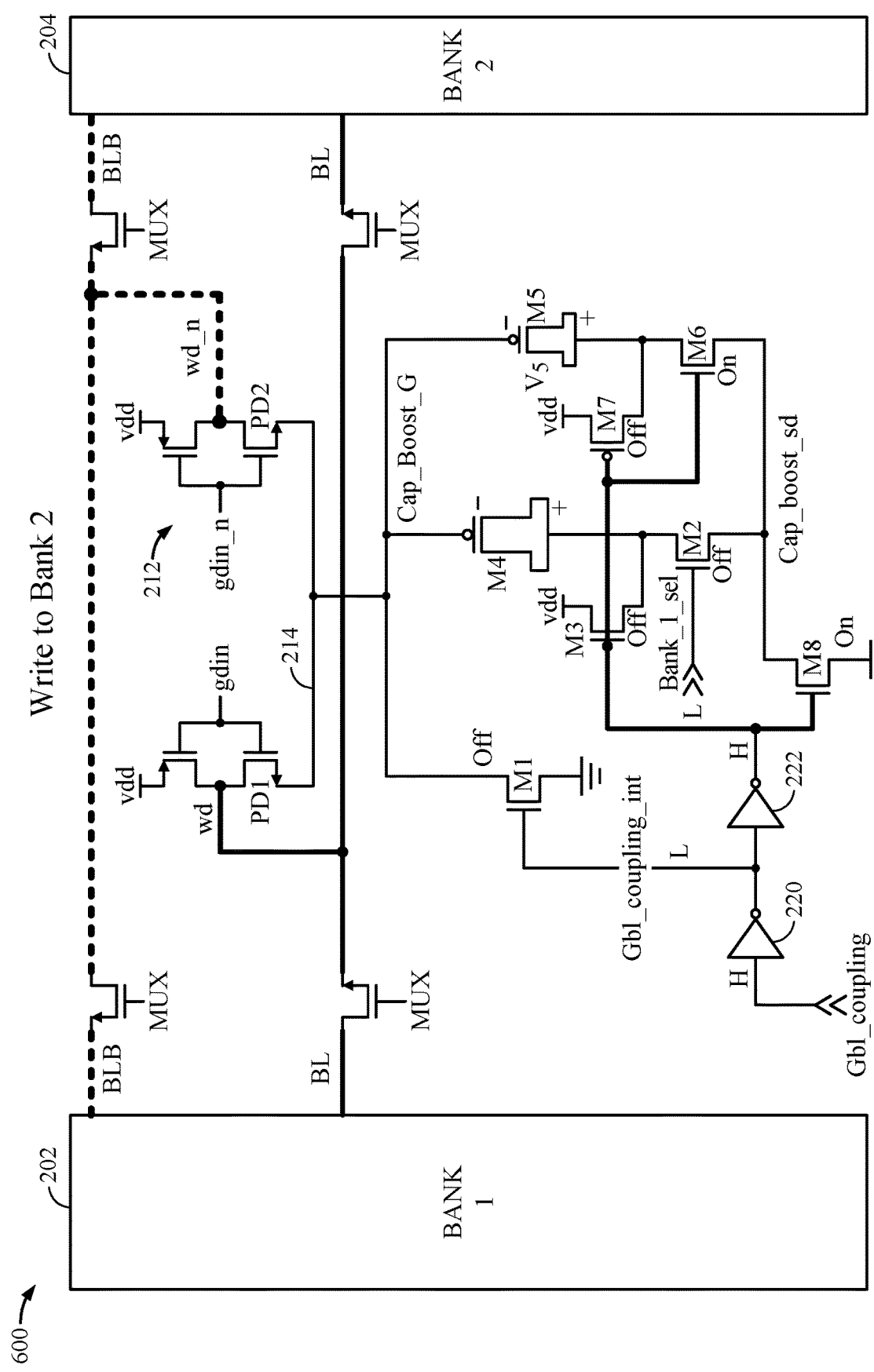
FIG. 6C illustrates the logic and switch states of the boost generation circuit of FIG. 6A during a write operation to Bank 2.

FIG. 6C illustrates the logic and switch states of the boost generation circuit 608 of FIG. 6A during a write operation to Bank 2, starting from the logic and switch states of FIG. 6A outside of a write operation, in accordance with certain aspects of the present disclosure. In this scenario, the Gbl_coupling signal transitions from L to H. Consequently, the first inverter 220 output is L, which turns off transistor M1 and disconnects the Cap_Boost_G node from ground. With the input of the second inverter 222 transitioning to L, the output of the second inverter 222 goes to H. Therefore, transistors M3 and M7 turn off, such that the sources/drains of transistors M4 and M5 are disconnected from Vdd. Also with the output of the second inverter 222 transitioning to H, transistors M6 and M8 are turned on, such that the voltage of the Cap_boost_sd node goes to ground (e.g., 0 V) and the source/drain of transistor M5 is connected to the Cap_boost_sd node. Since the voltage of a capacitive element cannot be instantaneously changed and the voltage at the Cap_boost_sd node is driven to L, the voltage across M5 (being higher at the source/drain of transistor M5 than at the gate of transistor M5 outside of the write operation) develops a negative potential at the gate of transistor M5, which may be completely transferred to the Cap_Boost_G node. Further during the write operation to Bank 2, the Bank_1_sel signal remains at L, leaving transistor M2 turned off. Therefore, transistor M4 stays disconnected from the Cap_Boost_G node and does not contribute as a coupling capacitive element during the write operation to Bank 2.

Although not illustrated, the Bank_1_sel signal in FIGS. 6A-6C may be replaced by an ACC signal, such that the alternative circuit topology for the boost generation circuit 608 may be used to modify the memory circuit 500 of FIG. 5 with ACC controllability in a similar manner as illustrated in FIGS. 6A-6C.

Certain aspects of the present disclosure provide a memory circuit (e.g., the memory circuit 400 of FIG. 4A, the memory circuit 500 of FIG. 5, or the memory circuit 600 of FIG. 6A). The memory circuit generally includes at least one memory bank (e.g., memory banks 202, 204), a write circuit (e.g., write circuit 206) coupled to the at least one memory bank, and a boost generation circuit (e.g., the boost generation circuit 408 of FIG. 4A, the boost generation circuit 508 of FIG. 5, or the boost generation circuit 608 of FIG. 6A) coupled to the write circuit. The boost generation circuit generally includes a first node (e.g., the Cap_Boost_G node) coupled to a reference potential node (e.g., node 214) of the write circuit; a second node (e.g., a Cap_boost_sd node), a first capacitive element (e.g., implemented by transistor M4 or a capacitor) having a first terminal coupled to the first node of the boost generation circuit; a first switch (e.g., switch implemented by transistor M1) configured to selectively couple the first node to a reference potential node (e.g., electrical ground 216) for the memory circuit; and a second switch (e.g., switch implemented by transistor M2) configured to selectively couple a second terminal of the first capacitive element to the second node of the boost generation circuit.

According to certain aspects, the memory circuit further includes a third switch (e.g., switch implemented by transistor M3) configured to selectively couple the second terminal of the first capacitive element to a voltage rail (e.g., Vdd), the voltage rail being configured during operation of the memory circuit to have a higher potential than the reference potential node for the memory circuit. For certain aspects, the memory circuit further includes a first inverter (e.g., inverter 220) having an input coupled to a control signal node (e.g., node 219 with Gbl_coupling signal) and having an output configured to control operation of the first switch; and a second inverter (e.g., inverter 222) having an input coupled to the output of the first inverter and having an output configured to control operation of the third switch. In this case, the control signal node may be configured to have a logic low signal before and after a write operation, such that the first switch is closed, the first node of the boost generation circuit has a voltage equal to the reference potential node for the memory circuit, the third switch is closed, and the second terminal of the first capacitive element has a positive potential with respect to the reference potential node for the memory circuit. Also in this case, the control signal node may be configured to have a logic high signal during a write operation, such that the first switch is open, the third switch is open, and the first node of the boost generation circuit has a negative potential with respect to the reference potential node for the memory circuit. For certain aspects, the memory circuit further includes a third inverter (e.g., inverter 224) having an input coupled to the output of the second inverter and having an output coupled to the second node of the boost generation circuit. In this case, the second node of the boost generation circuit may be configured to have a logic high level when the control signal node has the logic low signal before and after the write operation, and the second node of the boost generation circuit may be configured to have a logic low level when the control signal node has the logic high signal during the write operation. For certain aspects, the memory circuit further includes a fourth switch (e.g., switch implemented by transistor M8) coupled between the second node of the boost generation circuit and the reference potential node for the memory circuit, wherein the output of the second inverter is configured to control operation of the fourth switch.

According to certain aspects, the second switch comprises a transistor (e.g., transistor M2) having a drain coupled to the second terminal of the first capacitive element, a source coupled to the second node of the boost generation circuit, and a gate coupled to a control signal node (e.g., node 217 with the Bank_1_sel signal or the ACC signal). For certain aspects, the at least one memory bank comprises a first memory bank (e.g., bank 202) and a second memory bank (e.g., bank 204), where the first memory bank is larger than the second memory bank. For certain aspects, the control signal node is configured to have a logic high signal during a write operation to the first memory bank, such that the first capacitive element is effectively connected between the first and second nodes of the boost generation circuit, and the control signal node is configured to have a logic low signal during a write operation to the second memory bank, such that the first capacitive element is effectively disconnected from the second node of the boost generation circuit.

According to certain aspects, the first capacitive element comprises a transistor (e.g., transistor M4) having a gate coupled to the first terminal of the first capacitive element and having a source and a drain coupled together and to the second terminal of the first capacitive element.

According to certain aspects, the memory circuit further includes a second capacitive element (e.g., a capacitor or transistor M5) coupled between the first and second nodes of the boost generation circuit. For certain aspects, the second capacitive element comprises a transistor (e.g., transistor M5) having a gate coupled to the first node of the boost generation circuit and having a source and a drain coupled together and to the second node of the boost generation circuit. For certain aspects, the second capacitive element comprises a first terminal coupled to the first node of the boost generation circuit. In this case, the memory circuit may further include a third switch (e.g., transistor M3) configured to selectively couple the second terminal of the first capacitive element to a voltage rail (e.g., Vdd); a fourth switch (e.g., transistor M6) configured to selectively couple a second terminal of the second capacitive element to the second node of the boost generation circuit; and a fifth switch (e.g., transistor M7) configured to selectively couple the second terminal of the second capacitive element to the voltage rail, the voltage rail being configured during operation of the memory circuit to have a higher potential than the reference potential node for the memory circuit. For certain aspects, a control terminal (e.g., a transistor gate) of the third switch is coupled to a control terminal of the fourth switch and to a control terminal of the fifth switch.

According to certain aspects, the memory circuit comprises a static random-access memory (SRAM).

Figure 7:
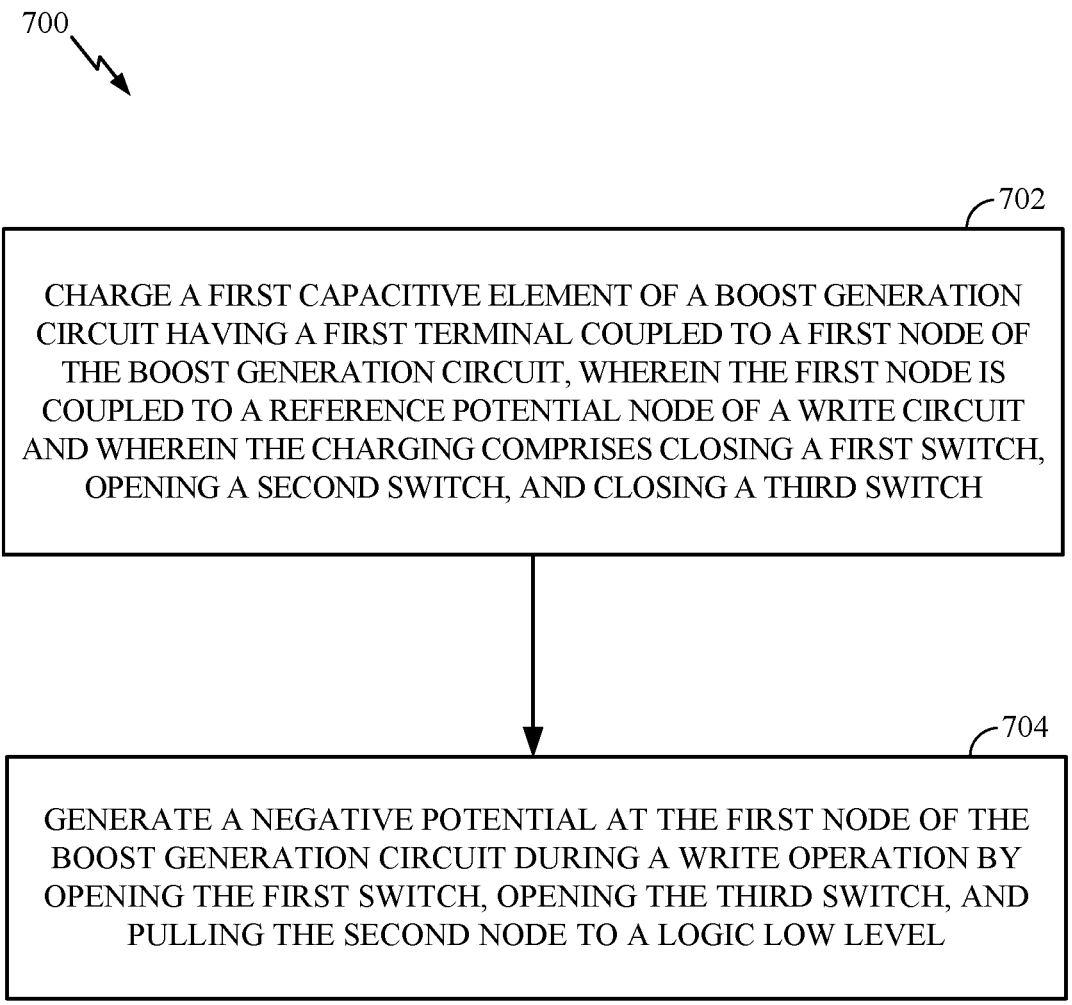
FIG. 7 is a flow diagram of example operations for writing data to a memory circuit having a boost generation circuit, in accordance with certain aspects of the present disclosure.

FIG. 7 is a flow diagram of example operations 700 for writing data to a memory circuit (e.g., the memory circuit 400 of FIG. 4A, the memory circuit 500 of FIG. 5, or the memory circuit 600 of FIG. 6A), in accordance with certain aspects of the present disclosure. The memory circuit includes at least one memory bank (e.g., memory banks 202, 204), a write circuit (e.g., write circuit 206) coupled to the at least one memory bank, and a boost generation circuit (e.g., the boost generation circuit 408 of FIG. 4A, the boost generation circuit 508 of FIG. 5, or the boost generation circuit 608 of FIG. 6A) coupled to the write circuit.

The operations 700 may begin, at block 702, with the memory circuit charging a first capacitive element (e.g., implemented by transistor M4 or a capacitor) of the boost generation circuit having a first terminal coupled to a first node (e.g., the Cap_Boost_G node) of the boost generation circuit. The first node is coupled to a reference potential node (e.g., node 214) of the write circuit. The charging at block 702 may involve closing a first switch (e.g., switch implemented by transistor M1) of the boost generation circuit, the first switch being coupled between the first node and a reference potential node (e.g., electrical ground 216) for the memory circuit. The charging at block 702 may also include opening a second switch (e.g., switch implemented by transistor M2) of the boost generation circuit coupled between a second terminal of the first capacitive element and a second node of the boost generation circuit. The charging at block 702 may further entail closing a third switch (e.g., switch implemented by transistor M3) of the boost generation circuit coupled between the second terminal of the first capacitive element and a voltage rail (e.g., Vdd) having a higher potential than the reference potential node for the memory circuit.

At block 704, the memory circuit may generate a negative potential at the first node of the boost generation circuit during a write operation. This generation may involve opening the first switch, opening the third switch, and pulling the second node to a logic low level.

According to certain aspects, generating the negative potential further entails closing the second switch.

According to certain aspects, the operations 700 further include the memory circuit charging a second capacitive element of the boost generation circuit. The second capacitive element is coupled between the first and second nodes of the boost generation circuit. In this case, charging the second capacitive element may involve driving the second node to a logic high level and closing the first switch of the boost generation circuit. For certain aspects, the second capacitive element comprises a first terminal coupled to the first node of the boost generation circuit. In this case, charging the second capacitive element may further include opening a fourth switch (e.g., switch implemented by transistor M6) of the boost generation circuit coupled between a second terminal of the second capacitive element and the second node of the boost generation circuit; and closing a fifth switch (e.g., switch implemented by transistor M7) of the boost generation circuit coupled between the second terminal of the second capacitive element and the voltage rail. For certain aspects, generating the negative potential at the first node of the boost generation circuit during the write operation at block 704 further involves closing the fourth switch and opening the fifth switch. For certain aspects, the memory circuit may open the fifth switch concurrently with the closing of the fourth switch and the opening of the third switch.

According to certain aspects, the at least one memory bank comprises a first memory bank and a second memory bank, where the first memory bank is larger than the second memory bank (i.e., unequal bank sizes). In this case, generating the negative potential at block 704 further involves closing the second switch if the write operation comprises a write operation to the first memory bank, such that the first capacitive element is effectively connected between the first and second nodes of the boost generation circuit; and generating the negative potential further comprises opening the second switch if the write operation comprises a write operation to the second memory bank, such that the first capacitive element is effectively disconnected from the second node of the boost generation circuit.

According to certain aspects, the first capacitive element comprises a transistor having a gate coupled to the first terminal of the first capacitive element and having a source and a drain coupled together and to the second terminal of the first capacitive element.

In some configurations, the term(s) "communicate," "communicating," and/or "communication" may refer to "receive," "receiving," "reception," and/or other related or suitable aspects without necessarily deviating from the scope of the present disclosure. In some configurations, the term(s) "communicate," "communicating," "communication," may refer to "transmit," "transmitting," "transmission," and/or other related or suitable aspects without necessarily deviating from the scope of the present disclosure.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A is electrically connected to object B (e.g., via a conductor, such as a trace or wire), and object B is electrically connected to object C, then objects A and C may still be considered coupled to one another—even if objects A and C are not directly electrically connected to each other. For instance, a first object may be coupled to a second object even though the first object is never directly electrically connected to the second object. The terms "circuit" and "circuitry" are used broadly, and intended to include both hardware implementations of electrical devices and conductors that, when connected and configured, enable the performance of the functions described in the present disclosure, without limitation as to the type of electronic circuits.

One or more of the components, steps, features, and/or functions illustrated herein may be rearranged and/or combined into a single component, step, feature, or function or embodied in several components, steps, or functions. Additional elements, components, steps, and/or functions may also be added without departing from novel features disclosed herein. The apparatus, devices, and/or components illustrated herein may be configured to perform one or more of the methods, features, or steps described herein. The algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b, and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A memory circuit comprising:
   at least one memory bank;
   a write circuit coupled to the at least one memory bank; and
   a boost generation circuit coupled to the write circuit, the boost generation circuit comprising:
      a first node coupled to a reference potential node of the write circuit;
      a second node;
      a first capacitive element having a first terminal coupled to the first node of the boost generation circuit;
      a first switch configured to selectively couple the first node to a reference potential node for the memory circuit;
      a second switch configured to selectively couple a second terminal of the first capacitive element to the second node of the boost generation circuit; and
      a second capacitive element coupled between the first and second nodes of the boost generation circuit, and coupled in parallel with the first capacitive element and the second switch.

2. The memory circuit of claim 1, further comprising a third switch configured to selectively couple the second terminal of the first capacitive element to a voltage rail, the voltage rail being configured during operation of the memory circuit to have a higher potential than the reference potential node for the memory circuit.

3. The memory circuit of claim 2, further comprising:
   a first inverter having an input coupled to a control signal node and having an output configured to control operation of the first switch; and
   a second inverter having an input coupled to the output of the first inverter and having an output configured to control operation of the third switch, wherein:
      the control signal node is configured to have a logic low signal before and after a write operation, such that the first switch is closed, the first node of the boost generation circuit has a voltage equal to the reference potential node for the memory circuit, the third switch is closed, and the second terminal of the first capacitive element has a positive potential with respect to the reference potential node for the memory circuit; and
      the control signal node is configured to have a logic high signal during a write operation, such that the first switch is open, the third switch is open, and the first node of the boost generation circuit has a negative potential with respect to the reference potential node for the memory circuit.

4. The memory circuit of claim 3, further comprising a third inverter having an input coupled to the output of the second inverter and having an output coupled to the second node of the boost generation circuit, wherein:
   the second node of the boost generation circuit is configured to have a logic high level when the control signal node has the logic low signal before and after the write operation; and
   the second node of the boost generation circuit is configured to have a logic low level when the control signal node has the logic high signal during the write operation.

5. The memory circuit of claim 3, further comprising a fourth switch coupled between the second node of the boost generation circuit and the reference potential node for the memory circuit, wherein the output of the second inverter is configured to control operation of the fourth switch.

6. The memory circuit of claim 1, wherein the second switch comprises a transistor having a drain coupled to the second terminal of the first capacitive element, a source coupled to the second node of the boost generation circuit, and a gate coupled to a control signal node.

7. The memory circuit of claim 6, wherein:
the at least one memory bank comprises a first memory bank and a second memory bank;
the first memory bank is larger than the second memory bank;
the control signal node is configured to have a logic high signal during a write operation to the first memory bank such that the first capacitive element is effectively connected between the first and second nodes of the boost generation circuit; and
the control signal node is configured to have a logic low signal during a write operation to the second memory bank such that the first capacitive element is effectively disconnected from the second node of the boost generation circuit.

8. The memory circuit of claim 1, wherein the first capacitive element comprises a transistor having a gate coupled to the first terminal of the first capacitive element and having a source and a drain coupled together and to the second terminal of the first capacitive element.

9. The memory circuit of claim 1, wherein the second capacitive element comprises a transistor having a gate coupled to the first node of the boost generation circuit and having a source and a drain coupled together and to the second node of the boost generation circuit.

10. The memory circuit of claim 1, wherein the second capacitive element comprises a first terminal coupled to the first node of the boost generation circuit, the memory circuit further comprising:
a third switch configured to selectively couple the second terminal of the first capacitive element to a voltage rail;
a fourth switch configured to selectively couple a second terminal of the second capacitive element to the second node of the boost generation circuit; and
a fifth switch configured to selectively couple the second terminal of the second capacitive element to the voltage rail, the voltage rail being configured during operation of the memory circuit to have a higher potential than the reference potential node for the memory circuit.

11. The memory circuit of claim 10, wherein a control terminal of the third switch is coupled to a control terminal of the fourth switch and to a control terminal of the fifth switch.

12. The memory circuit of claim 1, wherein the memory circuit comprises a static random-access memory (SRAM).

13. A method of writing data to a memory circuit comprising at least one memory bank, a write circuit coupled to the at least one memory bank, and a boost generation circuit coupled to the write circuit, the method comprising:
charging a first capacitive element of the boost generation circuit having a first terminal coupled to a first node of the boost generation circuit, wherein the first coupled to a reference potential node of the write circuit and wherein the charging comprises:
closing a first switch of the boost generation circuit, the first switch being coupled between the first node and a reference potential node for the memory circuit;
opening a second switch of the boost generation circuit coupled between a second terminal of the first capacitive element and a second node of the boost generation circuit; and closing a third switch of the boost generation circuit coupled between the second terminal of the first capacitive element and a voltage rail having a higher potential than the reference potential node for the memory circuit;
charging a second capacitive element of the boost generation circuit, wherein the second capacitive element is coupled between the first and second nodes of the boost generation circuit, and is coupled in parallel with the first capacitive element and the second switch; and
generating a negative potential at the first node of the boost generation circuit during a write operation by:
opening the first switch;
opening the third switch; and
pulling the second node to a logic low level.

14. The method of claim 13, wherein generating the negative potential further comprises closing the second switch.

15. The method of claim 13, wherein charging the second capacitive element comprises:
driving the second node to a logic high level; and
closing the first switch of the boost generation circuit.

16. The method of claim 15, wherein the second capacitive element comprises a first terminal coupled to the first node of the boost generation circuit and wherein charging the second capacitive element further comprises:
opening a fourth switch of the boost generation circuit coupled between a second terminal of the second capacitive element and the second node of the boost generation circuit; and
closing a fifth switch of the boost generation circuit coupled between the second terminal of the second capacitive element and the voltage rail.

17. The method of claim 16, wherein generating the negative potential at the first node of the boost generation circuit during the write operation further comprises:
closing the fourth switch; and
opening the fifth switch concurrently with the closing of the fourth switch and the opening of the third switch.

18. The method of claim 13, wherein:
the at least one memory bank comprises a first memory bank and a second memory bank;
the first memory bank is larger than the second memory bank;
generating the negative potential further comprises closing the second switch if the write operation comprises a write operation to the first memory bank, such that the first capacitive element is effectively connected between the first and second nodes of the boost generation circuit; and
generating the negative potential further comprises opening the second switch if the write operation comprises a write operation to the second memory bank, such that the first capacitive element is effectively disconnected from the second node of the boost generation circuit.

19. The method of claim 13, wherein the first capacitive element comprises a transistor having a gate coupled to the first terminal of the first capacitive element and having a source and a drain coupled together and to the second terminal of the first capacitive element.

* * * * *